United States Patent [19]
Tsubakihara et al.

[11] Patent Number: 5,800,193
[45] Date of Patent: Sep. 1, 1998

[54] ELECTRONIC COMPONENT CONNECTOR

[75] Inventors: Hidehiro Tsubakihara, Amagasaki; Yasushi Kajiwara, Kawaguchi; Michihiko Tetsuka, Urawa, all of Japan

[73] Assignees: Sumitomo Metal Industries Limited, Osaka; Enplas Corporation, Saitama, both of Japan

[21] Appl. No.: 710,553

[22] Filed: Sep. 19, 1996

[30] Foreign Application Priority Data

Sep. 20, 1995 [JP] Japan ................. 7-241373

[51] Int. Cl.⁶ .................................. H01R 11/22
[52] U.S. Cl. ........................................ 439/266
[58] Field of Search .......................... 439/71, 72, 73, 439/264, 266, 269.1, 680

[56] References Cited

U.S. PATENT DOCUMENTS

| | | | |
|---|---|---|---|
| 4,340,266 | 7/1982 | Grovender | 439/71 |
| 4,918,513 | 4/1990 | Kurose et al. | 357/74 |
| 4,993,955 | 2/1991 | Savant | 439/73 |
| 5,288,240 | 2/1994 | Savant | 439/266 |
| 5,330,359 | 7/1994 | Walker | 439/69 |
| 5,342,213 | 8/1994 | Kobayashi | 439/268 |
| 5,352,130 | 10/1994 | Nagumo | 439/266 |
| 5,352,131 | 10/1994 | Nagumo | 439/266 |
| 5,368,497 | 11/1994 | Nagumo | 439/266 |

FOREIGN PATENT DOCUMENTS

| | | |
|---|---|---|
| 64-86540 | 3/1989 | Japan . |
| 5-109456 | 4/1993 | Japan . |

*Primary Examiner*—Gary F. Paumen
*Assistant Examiner*—Yong Ki Kim
*Attorney, Agent, or Firm*—Banner & Witcoff, Ltd.

[57] ABSTRACT

An electronic component connector used for mounting an electronic component comprises a frame member and an elastic member attached to the frame member. The elastic member includes an elastic member attachment portion, an electronic component pressing portion, and a press-canceling member engagement portion. The elastic member attachment portion is attached to the frame member. The electronic component pressing portion is capable of pressing the electronic component toward the frame member. The press-canceling member engagement portion is integrally attached to the electronic component pressing portion. The electronic component pressing portion is movable in a direction away from the frame member by engaging a press-canceling member with the press-canceling member engagement portion, and moving the press-canceling member in a direction away from the frame member.

23 Claims, 11 Drawing Sheets

ELECTRONIC COMPONENT CONNECTOR

BACKGROUND OF THE INVENTION

1. Field of the Invention

The present invention relates to an electronic component connector, and particularly to an electronic component connector used for mounting onto an electronic circuit board an electronic component such as a chip-on-board module.

2. Description of the Related Art

Conventionally, when an electronic component such as a chip-on-board module is mounted onto an electronic circuit board, either of two methods is generally used to reduce the area or space occupied by the mounted electronic component. In the first method, a chip-on-board module is directly soldered to an electronic circuit board. In the second method, a metal terminal is attached to each electrode terminal of a chip-on-board module, and the metal terminal is soldered to an electronic circuit board. However, these methods of mounting an electronic component onto an electronic circuit board raise the following problems.

For example, when a ROM is included in a chip-on-board module and it becomes necessary to modify data contained in the ROM, it is necessary to remove from an electronic circuit board the chip-on-board module, which is directly soldered to the electronic circuit board or indirectly soldered to the electronic circuit board through metal terminals. In this case, there has been a risk of thermally or physically damaging the electronic circuit board.

Also, during a process of soldering a chip-on-board module directly onto an electronic circuit board, an LSI chip such as a ROM carried on the chip-on-board module has often been accidentally subjected to an undesirable thermal stress, resulting in the deteriorated reliability of the chip-on-board module.

In order to solve the above-mentioned problems, an IC socket for a chip carrier has been invented as disclosed in Japanese Patent Application Laid-Open (kokai) Nos. 64-86540 and 5-109456. However, these inventions also have the following drawbacks.

FIG. 1A is an exploded perspective view for explaining an IC socket disclosed in Japanese Patent Application Laid-Open (kokai) No. 64-86540. FIG. 1B shows a cross-sectional view of the IC socket.

As shown in FIGS. 1A and 1B, in the IC socket disclosed in Japanese Patent Application Laid-Open (kokai) No. 64-86540, a chip carrier 104 is pressed by a retaining member 107. In order to allow the chip carrier 104 to be attached to/removed from the retaining member 107, side edges of an inner opening of the retaining member 107 must be longer than shorter side edges of the chip carrier 104 (side edges along which electrode patterns are disposed). As a result, the shorter side edges of the chip carrier 104 cannot be pressed by the retaining member 107, resulting in a potential poor contact between connector pins 109 and the electrode patterns disposed on the chip carrier 104 along the shorter side edges. Since the chip carrier 104 is slid so as to be attached to/removed from the retaining member 107, it is less practicable to dispose electrode terminals (electrode patterns) on the chip carrier 104 along its side edges parallel to the sliding direction, and to dispose corresponding connector pins on a guide member 108 along its side edges parallel to the sliding direction, due to the following reasons. Even when new electrode patterns and corresponding connector pins are disposed along side edges parallel to the sliding direction, if the chip carrier 104 is not properly positioned, there may arise a failure to establish an electrical connection between an electric pattern and a connector pin. Also, the sliding action may cause a connector pin to be twisted and/or bended, resulting in a risk of deteriorating the reliability of electrical contact.

The invention disclosed in Japanese Patent Application Laid-Open (kokai) No. 5-109456 is said to solve the above-described problems involved in the invention disclosed in Japanese Patent Application Laid-Open (kokai) No. 64-86540. However, the disclosed invention requires a mechanism for moving a slider and a mechanism for anchoring the slider. As a result, a socket structure becomes complex accordingly.

SUMMARY OF THE INVENTION

In view of the foregoing, a major object of the present invention is to provide an electronic component connector with which an electronic component can be mounted onto/removed from an electronic circuit board without applying an undesirable stress such as thermal stress to the electronic component and the electric circuit board, that can establish a reliable electrical connection between each electrode terminal of the electronic component and a corresponding electrode of the electronic circuit board, and that has a simple structure.

Another object of the present invention is to provide an electronic component connector that allows another electronic component to be mounted under an electronic component mounted through use of the electronic component connector, so as to realize a layered structure of mounted electronic components.

The present invention provides an electronic component connector used for mounting an electronic component, comprising a frame member and an elastic member attached to the frame member. The elastic member includes an elastic member attachment portion, an electronic component pressing portion, and a press-canceling member engagement portion. The elastic member attachment portion is attached to the frame member. The electronic component pressing portion is capable of pressing the electronic component toward the frame member. The press-canceling member engagement portion is integrally attached to the electronic component pressing portion. The electronic component pressing portion is movable in a direction away from the frame member by engaging a press-canceling member with the press-canceling member engagement portion, and moving the press-canceling member in a direction away from the frame member.

Thus, the electronic component can be held onto the frame member by the elastic member. Further, the electronic component pressing portion is moved through use of the press-canceling member so as to bend the elastic member, thereby allowing the electronic component to be attached to/removed from the frame member. Accordingly, the electronic component can be held in place removably, which is attained in a simple structure. Also, while the electronic component is being mounted onto an electronic circuit board, application of thermal stress to the electronic component is suppressed or prevented.

Preferably, the press-canceling member engagement portion has a hole through which the press-canceling member is inserted.

The elastic member is preferably formed of a single plate and is capable of pressing the electronic component toward the frame member in a direction which lies in the plane of the plate. This provides a relatively large pressing force.

Preferably, the electronic component pressing portion includes a contact portion capable of making contact with the electronic component, and an elastic extending portion which extends from the contact portion toward the elastic member attachment portion. The bending center of the electronic component pressing portion at the time of canceling a pressing force which is applied toward the electronic component by the electronic component pressing portion is located at a frame member side with respect to the position where the contact portion gets in touch with the electronic component.

Thus, even when the electronic component pressing portion is bent to a relatively small extent, the electronic component can be attached to/removed from the frame member.

Also, preferably, the electronic component pressing portion includes a contact portion capable of making contact with the electronic component, and a curvature portion which extends from the contact portion toward the elastic member attachment portion. The curvature portion is curved toward the frame member.

Thus, even when the electronic component pressing portion is bent to a relatively small extent, the electronic component can be attached to/removed from the frame member.

Preferably, the electronic component pressing portion includes a contact portion capable of making contact with electronic component, a linear portion which extends substantially linearly and located at the contact portion side, and a curvature portion which is located at the elastic member attachment portion side. The linear portion and the curvature portion are located at the elastic member attachment portion side with respect to the contact portion, and the curvature portion is curved toward the frame member.

Thus, even when the electronic component pressing portion is bent to an even smaller extent, the electronic component can be attached to/removed from the frame member.

Preferably, the elastic member is electrically conductive. As a result, the elastic member can also serve as a lead terminal for electrical external connection of the electronic component. Thus, the structure of the electronic component connector becomes simpler. In this case, preferably, the conductive elastic member makes contact with an electrode for external connection of the electronic component.

In this case, more preferably, the conductive elastic member further includes an external connection portion. As a result, the conductive elastic member serves not only as a lead terminal for electrical external connection of the electronic component, but also as an external lead terminal for connection with the electronic circuit board. Thus, the structure of the electronic component connector becomes even more simple.

Also, preferably, the elastic member further includes a second electronic component pressing portion capable of pressing the electronic component in a direction away from the frame member.

Thus, the electronic component pressing portion and the second electronic component pressing portion press and hold the electronic component from both sides. Therefore, a burden on the frame member can be reduced accordingly, and the reliability of the electronic component connector can be improved, particularly in a high-temperature environment.

In this case, preferably, the second electronic component pressing portion is electrically conductive. As a result, the second electronic component pressing portion can also serve as a lead terminal for electrical external connection of the electronic component. Thus, the structure of the electronic component connector becomes simpler. Further, electrodes for external connection, which make contact with the elastic member, may be provided on either side of the electronic component.

Also, preferably, the electronic component connector of the present invention further includes a second elastic member attached to the frame member. The second elastic member includes a second elastic member attachment portion and a second electronic component pressing portion. The second elastic member attachment portion is attached to the frame member. The second electronic component pressing portion can press the electronic component in a direction away from the frame member.

Thus, the elastic member and the second elastic member press and hold the electronic component from both sides. Therefore, a burden on the frame member can be reduced accordingly, and the reliability of the electronic component connector can be improved, particularly in a high-temperature environment.

In this case, preferably, the second elastic member is electrically conductive. As a result, the second elastic member can also serve as a lead terminal for electrical external connection of the electronic component. Thus, the structure of the electronic component connector becomes simpler. Further, an electrode for external connection can be provided on both sides of the electronic component. Therefore, on each side of the electronic component the number of electrodes for external connection can be reduced, so that the size of the electronic component can be reduced accordingly. If the size of the electronic component remains unchanged, the processing of electrodes for external connection will become easier. In this case, preferably, the conductive second elastic member contacts an electrode for external connection of the electronic component.

More preferably, the second elastic member further includes a second external connection portion. As a result, the second elastic member serves not only as a lead terminal for electrical external connection of the electronic component, but also as an external lead terminal for connection with the electronic circuit board. Thus, the structure of the electronic component connector becomes even more simple.

Preferably, the electronic component connector of the present invention further includes a press-canceling member engagement member to which the press-canceling member can be engaged. This makes it more easy to attach the electronic component to the electronic component connector as well as to remove it from the connector.

More preferably, the press-canceling member engagement member comprises an engagement portion with which the press-canceling member can be engaged, and the engagement portion includes two side walls and a groove disposed therebetween. Still more preferably, one of the two side walls which is located closer to the electronic component pressing portion is higher than the other side wall so as to ensure the engagement of the press-canceling member with the engagement portion.

Preferably, in the electronic component connector of the present invention, a plurality of the conductive elastic members are attached to the frame member, and insulating separator members are respectively provided between the conductive elastic members. More preferably, the separator member includes a press-canceling member engagement portion to which the press-canceling member can be engaged. Still more preferably, the press-canceling member engagement portion comprises two side walls and a groove disposed therebetween. Yet still more preferably, one of the two side walls which is located closer to the electronic component pressing portion is higher than the other side wall so as to ensure the engagement of the press-canceling member with the press-canceling member engagement portion.

Preferably, in the electronic component connector of the present invention, a plurality of the conductive elastic members and a plurality of the second conductive elastic members are attached to the frame member, and the elastic members and the second elastic members are arranged such that insulating separator members are respectively disposed between each of the elastic member and each of the second elastic member. More preferably, the separator member includes a press-canceling member engagement portion with which the press-canceling member can be engaged. Still more preferably, the press-canceling member engagement portion comprises two side walls and a groove disposed therebetween. Yet still more preferably, one of the two side walls which is located closer to the electronic component pressing portion is higher than the other side wall so as to ensure the engagement of the press-canceling member with the press-canceling member engagement portion.

Preferably, in the electronic component connector of the present invention, the electronic component pressing portion can press the electronic component toward a first side of the frame member, the electronic component can be mounted onto the first side of the frame member, and the frame member has an opening which extends from the first side to an opposite second side. More preferably, the frame member has a predetermined height between the first and second sides, and when the frame member is mounted on the electronic circuit board such that the second side faces the electronic circuit board, another electronic component can be mounted onto a portion of the electronic circuit board which is exposed in the opening.

Thus, another electronic component can be mounted under the electronic component, thereby realizing a layered structure of mounted components. This reduces the area occupied by electronic components mounted on the electronic circuit board.

Also, the electronic component carried on the electronic component connector according to the present invention can be mounted onto the electronic circuit board on which another electronic component is already mounted. After the electronic component is mounted onto the electronic circuit board through use of the electronic component connector according to the present invention, the electronic component can be removed from the electronic component connector so as to inspect or replace another electronic component which is mounted under the electronic component.

Preferably, in the electronic component connector of the present invention, positioning members are projected from the frame member so as to facilitate the positioning of the electronic component.

The electronic component connector of the present invention may further include the press-canceling member.

The present invention also provides a connector-attached electronic component, comprising an electronic component and a connector which includes a frame member and an elastic member attached to the frame member. The elastic member includes an elastic member attachment portion, an electronic component pressing portion, and a press-canceling member engagement portion. The elastic member attachment portion is attached to the frame member. The electronic component pressing portion is capable of pressing the electronic component toward the frame member. The press-canceling member engagement portion is integrally attached to the electronic component pressing portion. The electronic component pressing portion is movable in a direction away from the frame member, by engaging press-canceling member with the press-canceling member engagement portion and moving the press-canceling member in a direction away from the frame member, thereby allowing the electronic component to be attached to/removed from the connector.

BRIEF DESCRIPTION OF THE DRAWINGS

The above and further objects, features and advantages of the present invention will become more apparent from the following detailed description taken in conjunction with the accompanying drawings, wherein.

DESCRIPTION OF THE PREFERRED EMBODIMENTS

First Embodiment

Figure 4A:
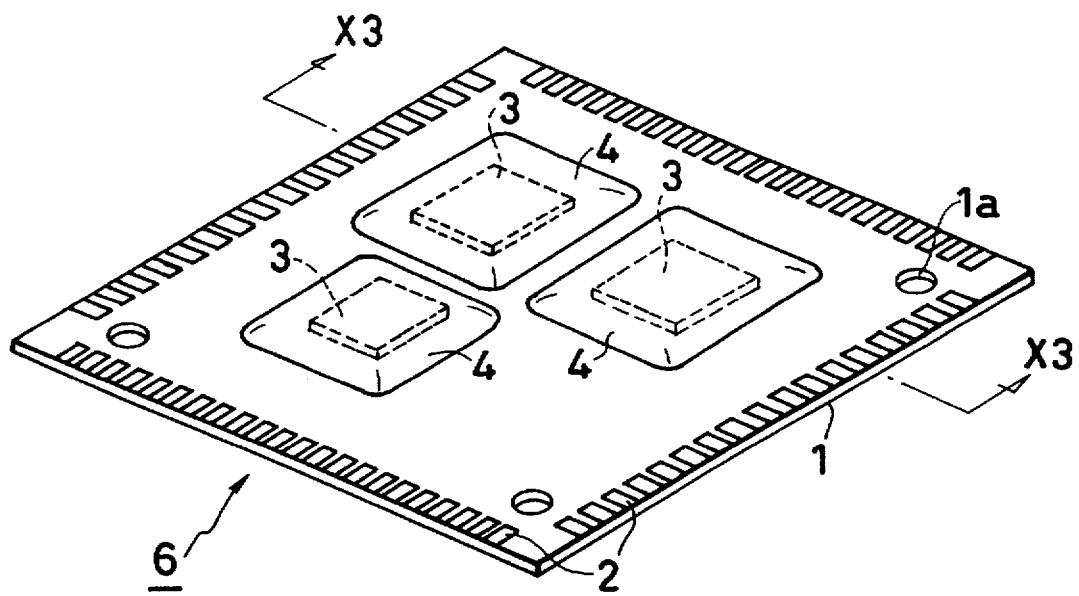
FIG. 4A is a schematic perspective view for explaining a chip-on-board module to be mounted through use of an electronic component connector according to each embodiment of the present invention.
Figure 4B:
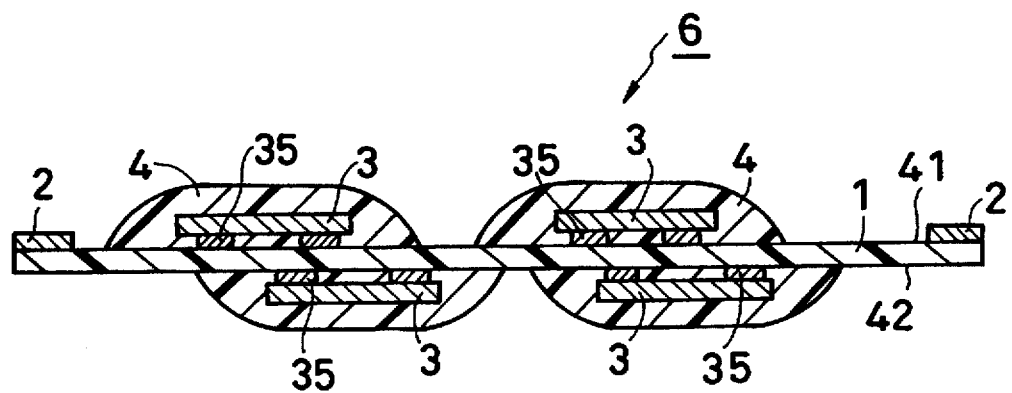
FIG. 4B is a schematic cross-sectional view for explaining the chip-on-board module to be mounted through use of the electronic component connector according to each embodiment of the present invention.

First, a chip-on-board module 6 to be mounted onto an electronic component connector will be described with reference to FIGS. 4A and 4B. The chip-on-board module 6 of the present embodiment includes a board 1 and LSI chips 3 mounted on both main faces 41 and 42 of the board 1. The board 1 is a multilayer printed wiring board formed of glass epoxy resin or the like. A positioning hole 1a is formed at each of three corners of the board 1. Bump electrodes 35 are disposed on both main faces 41 and 42 of the board 1 so as to be connected with the LSI chips 3 by flip chip bonding. Electrode terminals 2 are disposed on the main face 41 of the board 1 so as to be connected with an external circuit. The bump electrodes 35 and the electrodes 2 are connected through wiring patterns (not shown) on the board 1. Each of the LSI chips 3 is covered for protection with a potting resin 4.

As shown in FIGS. 2A, 2B, 3A, and 3B, an electronic component connector 12 according to the present embodiment includes a frame member 8, a contact pin 5, a positioning pin 10, a separator member 11, and a connection rod 7. The chip-on-board module 6 is attached to the electronic component connector 12, thereby forming a connector-attached electronic component 50 of the present embodiment.

The frame member 8 is made of metal or heat resistant plastic. The frame member 8 has a square planar shape and has a square opening 81 formed at its central portion.

The positioning pin 10 projects from a top face 82 of the frame member 8 at each of three predetermined positions located along the peripheral portion of the frame member 8. The positioning pins 10 are fit into the corresponding positioning holes 1a of the chip-on-board module 6 so as to guide and position the chip-on-board module 6.

The frame member 8 of the electronic component connector 12 is placed on an electronic circuit board 27, thereby mounting on the electronic circuit board 27 the electronic component connector 12 which carries the chip-on-board module 6. The electronic circuit board 27 includes a board 22, which is a multilayer printed wiring board formed of a glass epoxy resin or the like and on a top face 24 of which electrodes 20 and 23 and the like are formed.

The frame member 8 has a predetermined height $h_0$, so that another electronic component 31 can be mounted onto a portion of the electronic circuit board 27 which is exposed in the opening 81 of the frame member 8 and is under the chip-on-board module 6. The terminals 32 of the electronic component 31 are soldered to electrodes 23 on the electronic circuit board 27, whereby the electronic component 31 is mounted onto the electronic circuit board 27.

A plurality of contact pins 5 are held on the frame member 8 along each of four side peripheral portions 85. Each of the contact pins 5 has a shape substantially of the letter "C" as viewed from a side and is formed of an elastic metal such as beryllium copper having a spring property. The contact pin 5 has a press fit portion 5d, which is formed at a substantially central portion, a module connection portion 5j, and an electronic circuit board connection portion 5k. The press fit portion 5d of each contact pin 5 is press-fit into each of a plurality of press fit holes 8d, which are formed in the frame member 8 along each of the four side peripheral portions 85, thereby aligning and holding the contact pins 5 in array along each of the four side peripheral portions 85. In order to insulate the contact pins 5 from each other, a plurality of separator members 11 are disposed on a top face 84 of the frame member 8 along each of the four side peripheral portions 85 such that the separator members 11 and the contact pins 5 are arranged in an alternating manner. A plurality of the separator members 11 are formed upright on a separator member base 11b. The plurality of the separator members 11 and the separator member base 11b are integrally formed. The separator member base 11b is attached to a top face 84 of the frame member 8 along each of the four side peripheral portions 85. There are formed in the separator member base 11b through-holes (not shown) into which each of the contact pins 5 can be inserted. The separator members 11 and the separator member base 11b are made of glass fiber reinforced liquid crystal polymer plastic.

The contact pin 5 is disposed in the following manner. The module connection portion 5j of the contact pin 5 comes above the frame member 8, and its tip 5a makes contact with an electrode terminal 2a of the chip-on-board module 6. On the other hand, the electronic circuit board connection portion 5k of the contact pin 5 is located outside the frame member 8, and its tip 5b makes contacts with the electrode 20 formed on the electronic circuit board 27. The contact pin 5 elastically presses at the tip 5a the chip-on-board module 6 toward the frame member 8, and is soldered at the tip 5b to the electrode 20.

A rod-receiving portion 5p having a rod hole 5e is formed on the module connection portion 5j of the contact pin 5 in the vicinity of the tip 5a. A connection rod 7 to cancel a pressing force of the contact pin 5 is to be inserted through the rod hole 5e.

The separator member 11, which is provided on the top face 84 of the frame member 8 along the side peripheral portion 85, has an engagement portion 11e having a semi-circular cross-section for engaging the connection rod 7 thereinto. The engagement portion 11e includes two side walls 11f and 11g and a semicircular groove 11h disposed therebetween. The height of the side wall 11f is the same as that of the side wall 11g. The semicircular groove 11h is used to accommodate the lower portion of the connection rod 7.

In the electronic component connector 12 having the above described structure or the connector-attached electronic component 50, the chip-on-board module 6 is attached thereto/removed therefrom in the following manner.

Figure 1A:
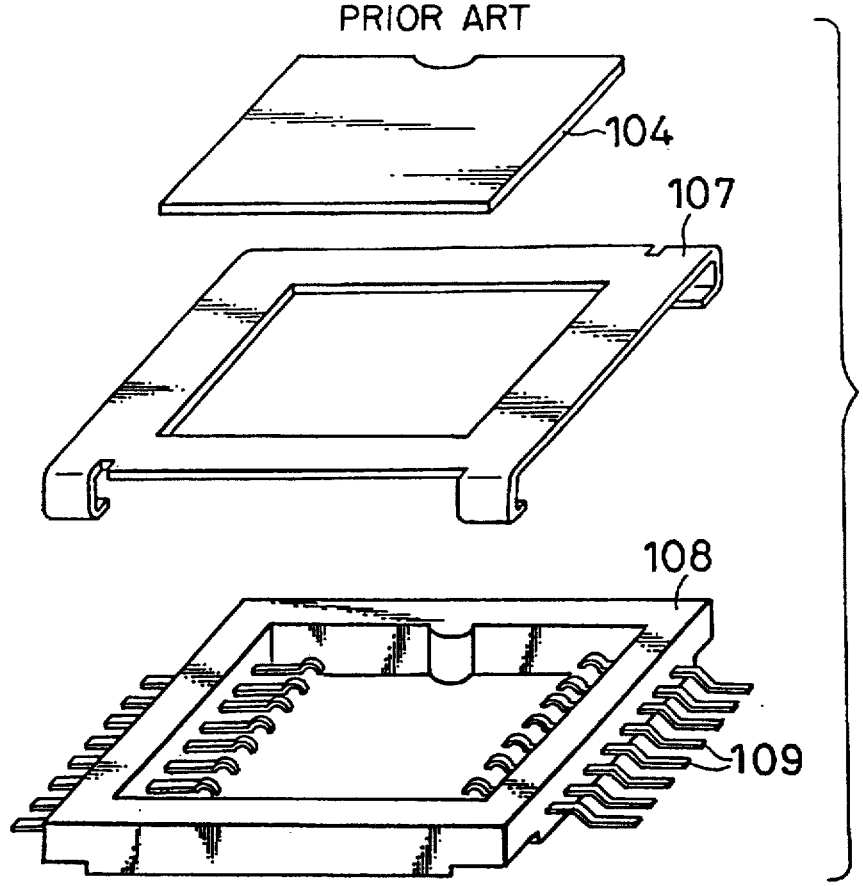
FIG. 1A is an exploded perspective view for explaining a conventional IC socket.
Figure 1B:
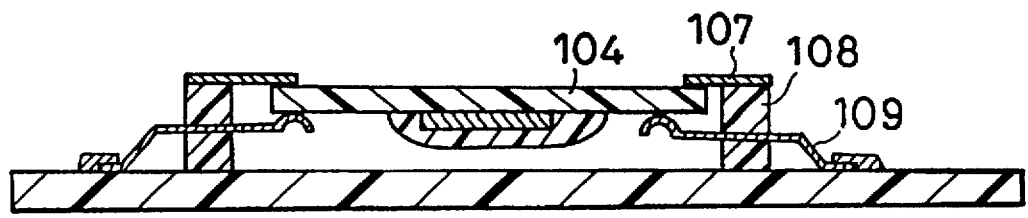
FIG. 1B is a cross-sectional view showing the conventional IC socket.
Figure 2A:
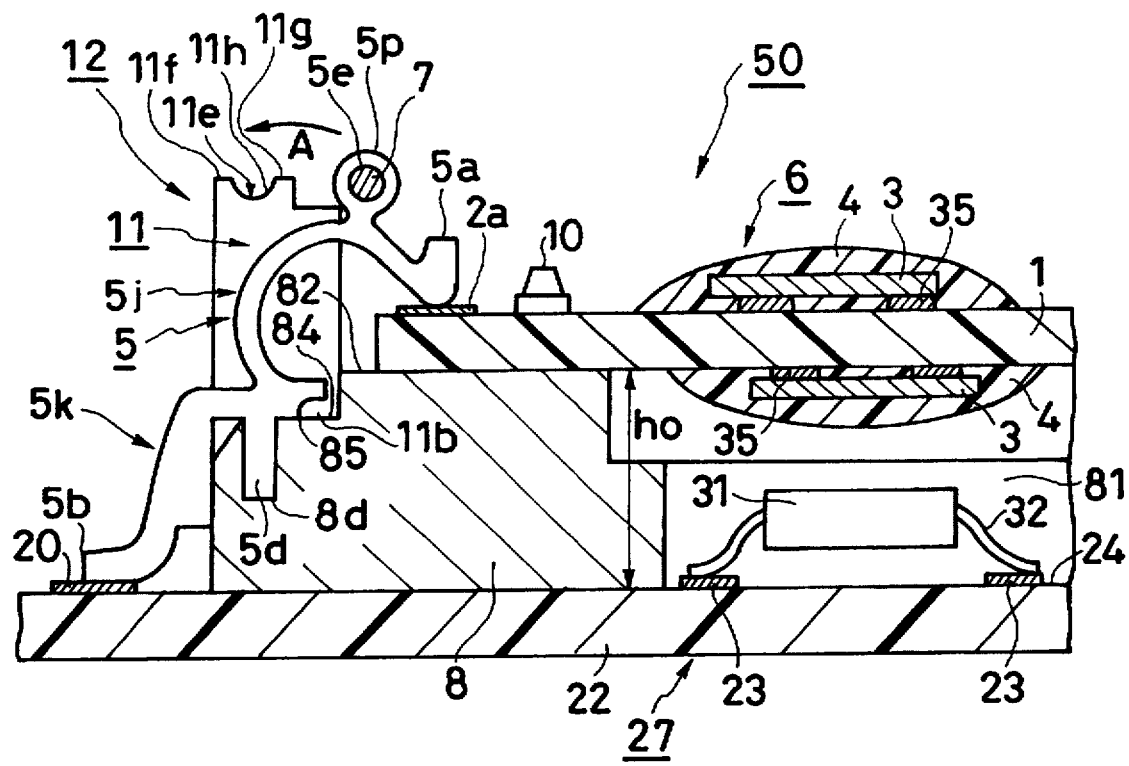
FIG. 2A is an enlarged partial cross-sectional view for explaining an electronic component connector according to a first embodiment of the present invention.

When the chip-on-board module 6 is attached to the electronic component connector 12, the connection rod 7 is inserted into the rod holes 5 of the contact pins 5, and then the connection rod 7 is moved in the direction of arrow A of FIG. 2A, thereby opening the module connection portions 5j of the contact pins 5. Subsequently, while the module connection portions 5j are being opened, the chip-on-board module 6 is placed on the frame member 8 such that the positioning holes 1a in the chip-on-board module 6 are fit to the positioning pins 10 projecting from the frame member 8. The frame member 8 serves as a stopper to mount the chip on board module 6 in place. Then, the opened module connection portions 5j are released from the opened state, thereby allowing the module connection portions 5j to return to its original position. As a result, the tips 5a of the contact pins 5 contact the electrode terminals 2a of the chip-on-board module 6. At the same time, the contact pins 5 elastically press toward the frame member 8 the chip-on-board module 6 at the electrode terminals 2a, thereby fixing the chip-on-board module 6 in place.

When the chip-on-board module 6 is removed from the electronic component connector 12, the connection rod 7 is inserted into the rod holes 5 of the contact pins 5, and then the connection rod 7 is moved in the direction of arrow A of FIG. 2A until the tips 5a of the contact pins 5 are moved away from the space above the chip-on-board module 6, thereby opening the module connection portions 5j of the contact pins 5. Subsequently, while the module connection portions 5j are maintained in the opened state, the chip-on-board module 6 is removed from the electronic component connector 12.

When the connection rod 7 is engaged with the engagement portions 11e formed in the separator members 11, the contact pins 5 are maintained in the opened state. This allows a user to readily attach the chip-on-board module 6 to the electronic component connector 12 as well as to remove the chip-on-board module 6 from the electronic component connector 12.

When the connection rod 7 is formed of an insulating material such as ceramics, the connection rod 7 may be left inserted into the rod holes 5e. Alternatively, after the chip-on-board module 6 is attached to/removed from the electronic component connector 12, the connection rod 7 may be removed. In the case where the connection rod 7 is removed, the connection rod 7 may be formed of a metal such as stainless steel. After the connection rod 7 is removed, the individual contact pins 5 can move independently. Thus, even when the thickness of the chip-on-board module 6 varies along a side of the chip-on-board module 6, variations in thickness are absorbed by the independent move of the individual contact pins 5. This provides reliable contact between the contact pins 5 and the electrode terminals 2a.

Figure 2B:
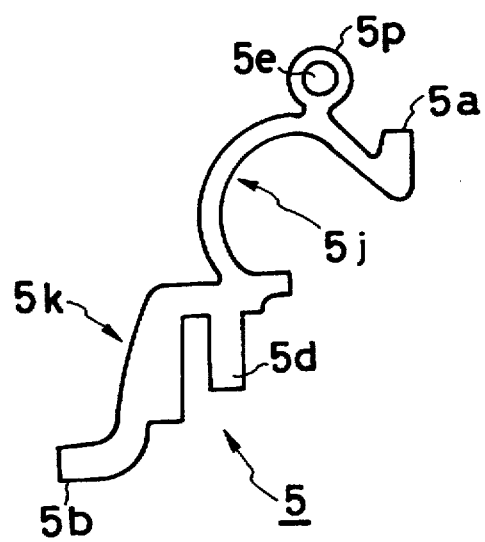
FIG. 2B is a schematic side view showing a contact pin used in the electronic component connector according to the first embodiment.
Figure 2C:
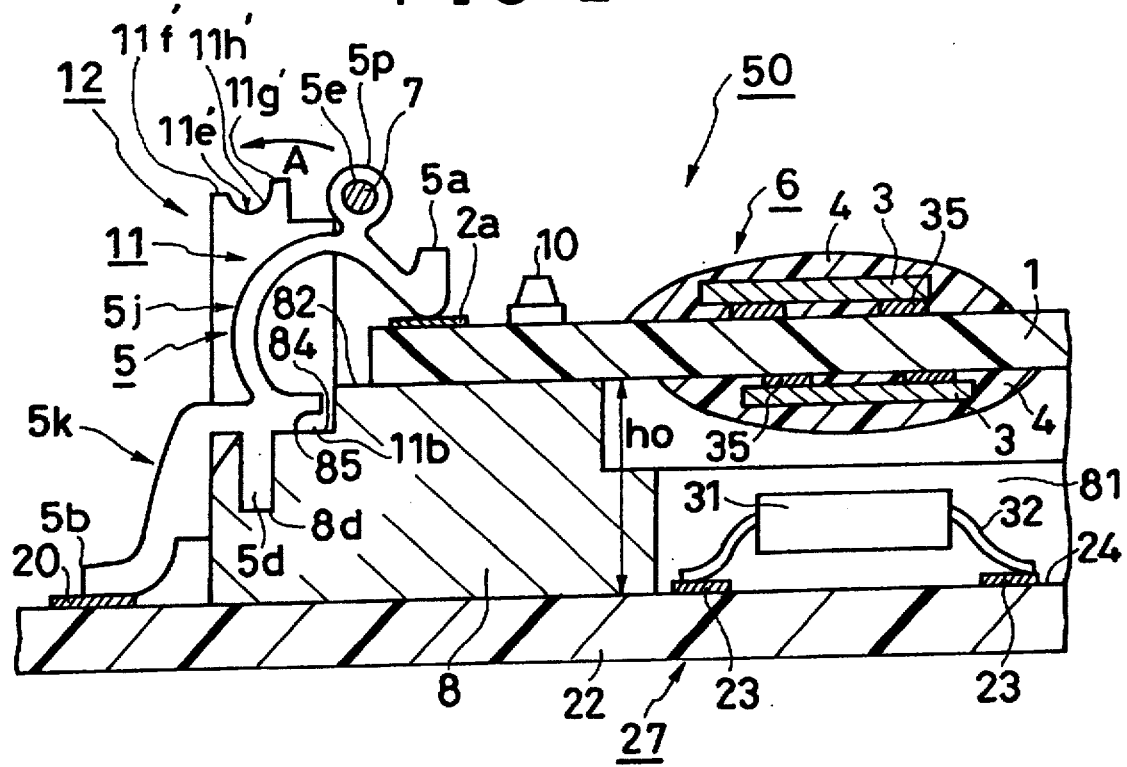
FIG. 2C is an enlarged partial cross-sectional view for explaining another engagement portion used in the electronic component connector according to the first embodiment.
Figure 3A:
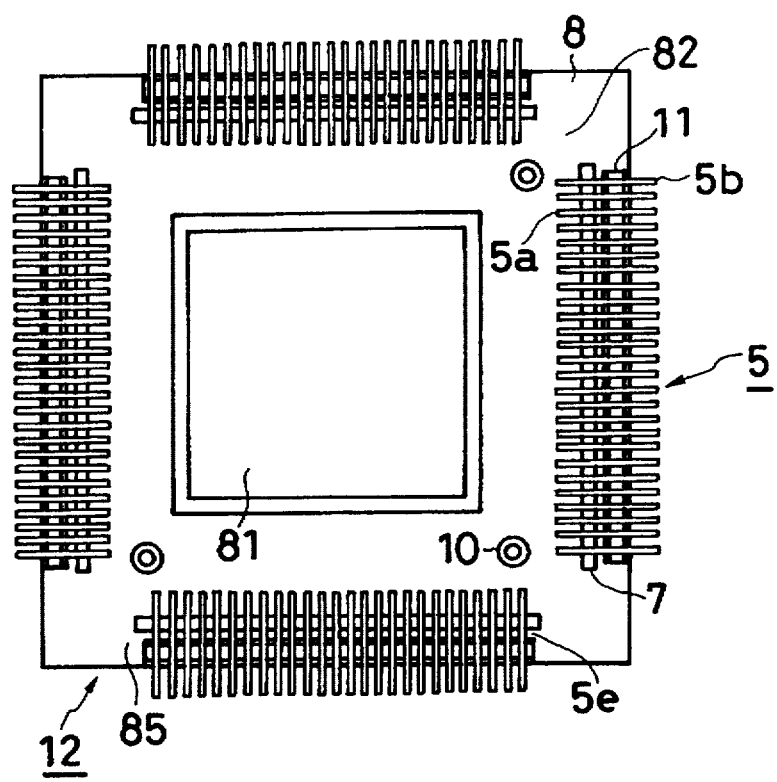
FIG. 3A is a schematic plan view for explaining the electronic component connector according to the first embodiment.
Figure 3B:
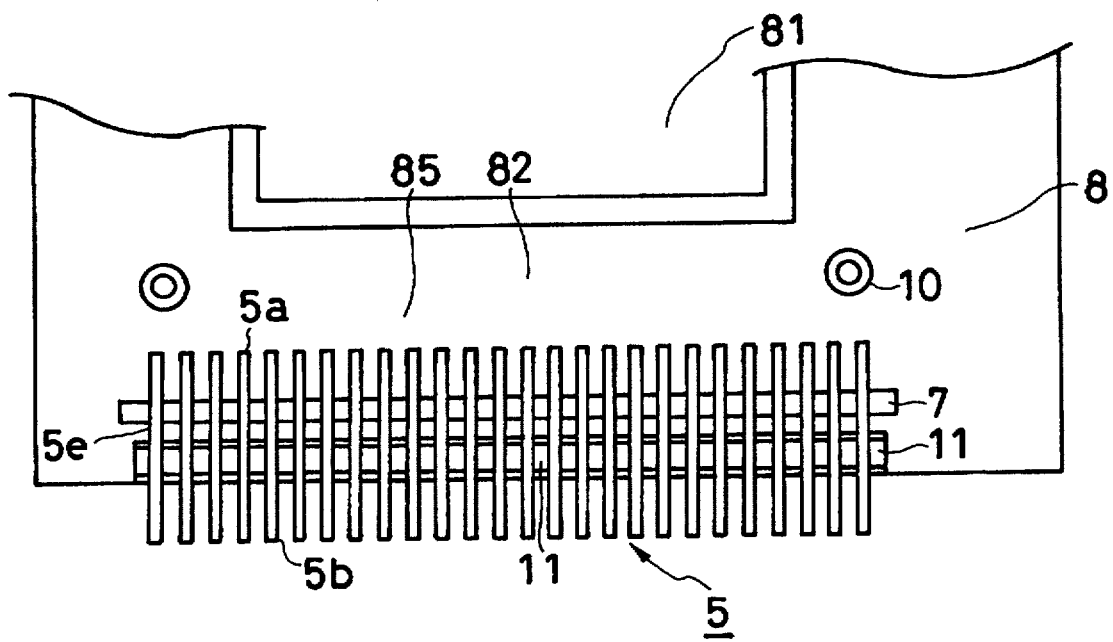
FIG. 3B is an enlarged partial schematic plan view for explaining the electronic component connector according to the first embodiment.

The separator member 11 may have another structure as shown in FIG. 2C. The separator member 11 shown in FIG. 2C includes an engagement portion 11e' having two side walls 11f' and 11g' and a semicircular groove 11h' disposed therebetween. The side wall 11g' is higher than the side wall 11f' to ensure the engagement of the connection rod 7 with the engagement portion 11e'.

As described above, through use of the electronic component connector 12 according to the present embodiment, the chip-on-board module 6 can be readily positioned merely by fitting the positioning holes 1a in the chip-on-board module 6 to the positioning pins 10 projecting from the frame member 8. Also, the contact pins 5 can be opened through use of the connection rod 7 so as to readily attach the chip-on-board module 6 to or remove it from the electronic component connector 12. Further, the contact pins 5 elastically press toward the frame member 8 the chip-on-board module 6 at the electrode terminals 2a, thereby fixing the chip-on-board module 6 in place. Thus, as compared with a conventional technique using a slider, the chip-on-board module 6 can be fixed onto the electronic component connector 12 in a simpler manner, while a good electronic contact can be maintained through the contact pins 5 between the electrode terminals 2a and the electrode 20 of the electronic circuit board 27. Also, even when there exist variations in the thickness of the chip-on-board module 6, the variations can be absorbed, thereby maintaining a reliable electrical contact between the electrode terminals 2a and the electrodes 20.

Also, the electronic component connector 12 has the opening 81 at its central portion, and the frame member 8 of the electronic component connector 12 has the predetermined height $h_0$. Thus, another electronic component 31 can be mounted under the chip-on-board module 6, thereby realizing a layered structure of mounted components. This reduces an area occupied by mounted components on the electronic circuit board 27.

Further, the chip-on-board module 6 carried on the electronic component connector 12 can be mounted onto the electronic circuit board 27 on which another electronic component 31 is already mounted. After the chip-on-board module 6 is mounted onto the electronic circuit board 27 through use of the electronic component connector 12, the chip-on-board module 6 can be removed from the electronic component connector 12 so as to inspect or replace the electronic component 31 which is mounted under the chip-on-board module 6. The chip-on-board module can be readily attached to/removed from the electronic component connector 12 by opening/closing the contact pins 5 through use of the connection rod 7.

Second Embodiment

Figure 5A:
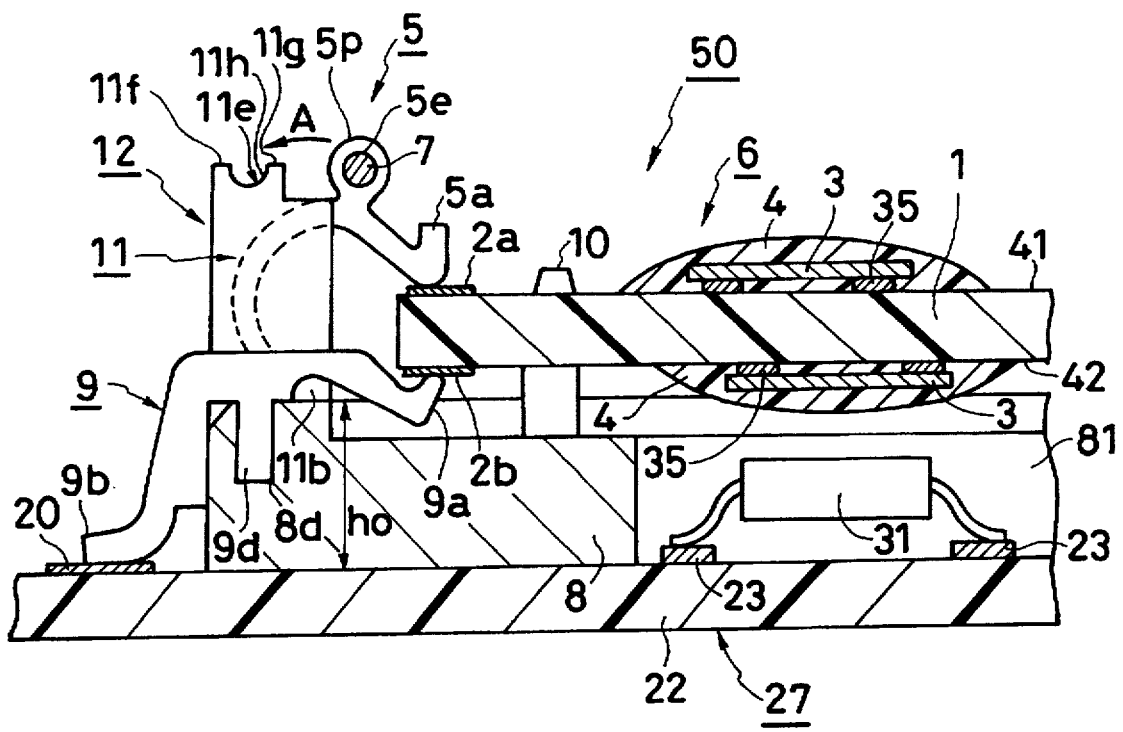
FIG. 5A is an enlarged partial cross-sectional view for explaining an electronic component connector according to a second embodiment of the present invention.
Figure 5B:
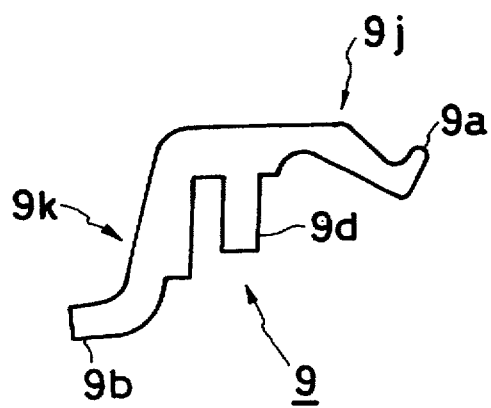
FIG. 5B is a schematic side view showing a contact pin used in the electronic component connector according to the second embodiment.

As seen from FIGS. 5A and 5B, an electronic component connector 12 according to a second embodiment of the present invention has a structure that the contact pins 5 shown in FIG. 2B and contact pins 9 shown in FIG. 5B are arranged in an alternating manner. The contact pin 9, similar to the contact pin 5, is formed of an elastic metal such as beryllium copper having a spring property.

As in the first embodiment, a press fit portion 5d of each contact pin 5 is press-fit into each of the plurality of press fit holes 8d, which are formed in the frame member 8 along each of the four side peripheral portions, thereby holding the contact pins 5 in array along each of the four side peripheral portions. The contact pin 9 has a press fit portion 9d, which is formed at a substantially central portion, a module connection portion 9j, and an electronic circuit board connection portion 9k. As in the case of the contact pin 5, the press fit portion 9d of each contact pin 9 is press-fit into each of a plurality of press fit holes 8d, which are formed in the frame member 8 along each of the four side peripheral portions, thereby aligning and holding the contact pins 9 in array along each of the four side peripheral portions. The contact pins 9, and the contact pins 5 which have been described in the section of the first embodiment, are arranged in an alternating manner along each of the four side peripheral portions of the frame member 8, with separator members 11 being respectively interposed between the contact pins 9 ad 5. That is, they are arranged in the order of the contact pin 9, the separator member 11, the contact pin 5, the separator member 11, the contact pin 9 . . . .

The separator member 11 according to the present invention also includes an engagement portion 11e having two side walls 11f and 11g and a semicircular groove 11h disposed therebetween. The height of the side wall 11f is the same as that of the side wall 11g. The semicircular groove 11h is used to accommodate the lower portion of the connection rod 7.

In a chip-on-board module 6 for use in the present embodiment, electrode terminals 2a and 2b are formed on both faces 41 and 42, respectively, of the board 1 so as to make connection with an external circuit.

As in the first embodiment, the tip 5a of the module connection portion 5j of the contact pin 5 makes contact with the electrode terminal 2a formed on the main face 41 of the chip-on-board module 6. Also, the tip 5b of the electronic circuit board connection portion 5k of the contact pin 5 contacts a corresponding electrode 20 formed on the electronic circuit board 27. The contact pin 5 elastically presses the chip-on-board module 6 toward the frame member 8 through the tip 5a, and is soldered at the tip 5b to the electrode 20.

The contact pin 9 is disposed in the following manner. The module connection portion 9j of the contact pin 9 comes above the frame member 8, and its tip 9a contacts an electrode terminal 2b formed on the main face 42 of the chip-on-board module 6. On the other hand, the tip 9b of the electronic circuit board connection portion 9k of the contact pin 9 contacts the electrode 20 formed on the electronic circuit board 27. The contact pin 9 elastically supports the chip-on-board module 6 while pressing it in the direction away from the frame member 8 through the tip 9a, and is soldered at the tip 9b to the electrode 20.

Figure 5C:
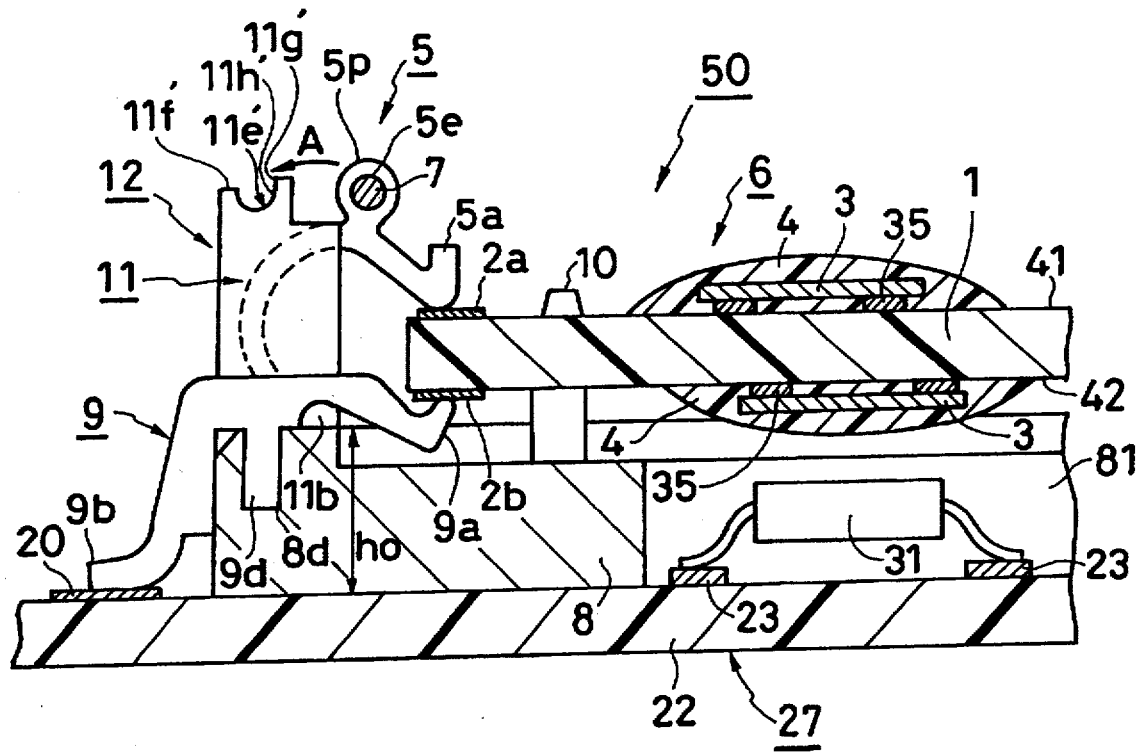
FIG. 5C is an enlarged partial cross-sectional view for explaining another engagement portion used in the electronic component connector according to the second embodiment.

The separator member 11 may have another structure as shown in FIG. 5C. The separator member 11 shown in FIG. 5C includes an engagement portion 11e' having two side walls 11f' and 11g' and a semicircular groove 11h' disposed therebetween.

The side wall 11g' is higher than the side wall 11f' to ensure the engagement of the connection rod 7 with the engagement portion 11e'.

In the electronic component connector 12 having the above-described structure according to the present embodiment, the chip-on-board module 6 is attached thereto/removed therefrom in a manner similar to that for the electronic component connector 12 according to the first embodiment.

Also, in the present embodiment, the electronic component connector 12 has an opening 81 at its central portion, and the frame member 8 of the electronic component connector 12 has a predetermined height $h_0$. Thus, another electronic component 31 can be mounted under the chip-on-board module 6. As a result, as in the case of the electronic component connector 12 according to the first embodiment, a layered structure of mounted components can be realized. This reduces an area occupied by mounted components on the electronic circuit board 27. Also, the chip-on-board module 6 can be readily attached to/removed from the electronic component connector 12. Thus, after the chip-on-board module 6 is mounted onto the electronic circuit board 27 through use of the electronic component connector 12, the chip-on-board module 6 can be removed from the electronic component connector 12 so as to inspect or replace the electronic component 31 which is mounted under the chip-on-board module 6.

The electronic component connector 12 according to the present embodiment has a function similar to that provided by the contact pins 5 in the electronic component connector 12 according to the first embodiment. Further, since the present embodiment uses the contact pins 9 in addition to the contact pins 5, in addition to an electrical connection established through the contact pins 5 between the electrode terminals 2a of the chip-on-board module 6 and the electrodes 20 of the electronic circuit board 27, an electrical connection is also established through the contact pins 9 between the electrode terminals 2b of the chip-on-board module 6 and the electrodes 20 of the electronic circuit board 27. Thus, the electrode terminals 2a and 2b can be formed on the upper and lower faces 41 and 42, respectively, of the chip-on-board module 6. This allows a reduction in the number of the electrode terminals 2a and 2b formed on the surfaces 41 and 42, respectively, of the chip-on-board module 6, thereby facilitating an etching work required for forming the electrode terminals 2a and 2b. Also, the contact pins 5 and the contact pins 9 are arranged in an alternating manner, and the chip-on-board module 6 is held between and fixed by the neighboring contact pins 5 and 9. Accordingly, the contact pins 5 and the contact pins 9 cooperatively support the chip-on-board module 6, thereby reducing a burden on the frame member 8 with respect to the holding/fixing of the chip-on-board module 6. This improves the reliability of the electronic component connector 12, especially in a high-temperature environment.

Third Embodiment

Figure 6A:
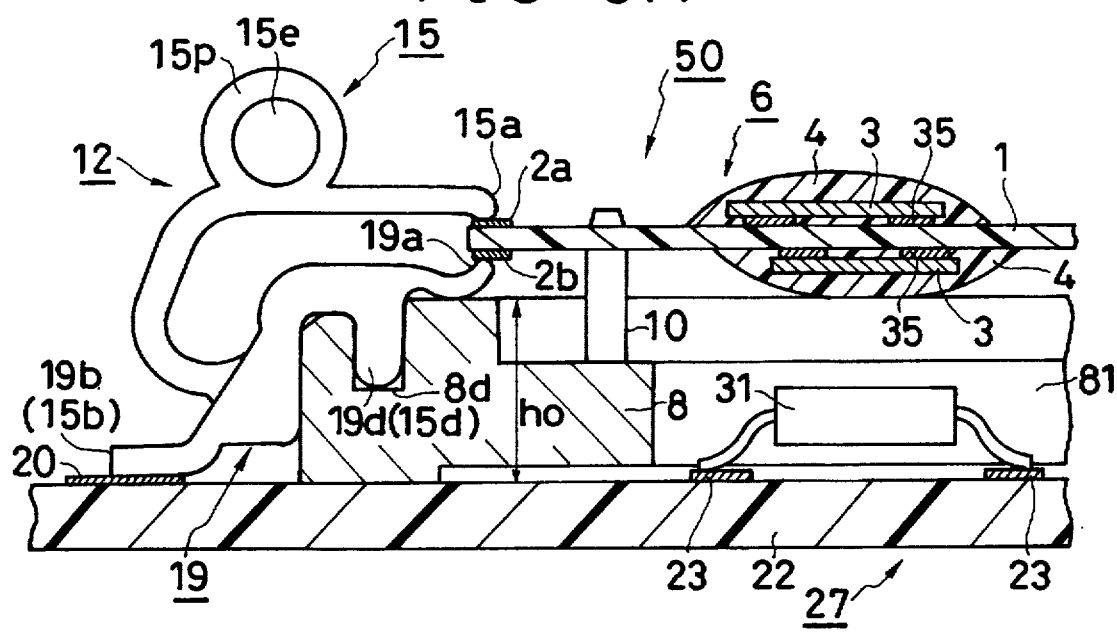
FIG. 6A is an enlarged partial cross-sectional view for explaining an electronic component connector according to a third embodiment of the present invention.
Figure 6B:
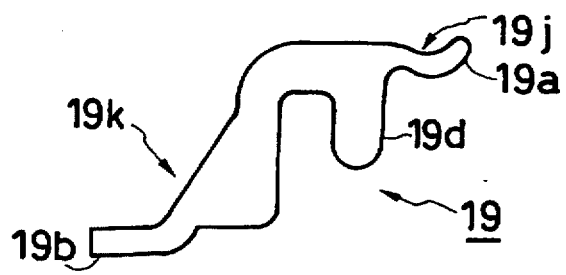
FIGS. 6B and 6C are schematic side views showing contact pins used in the electronic component connector according to the third embodiment.
Figure 6C:
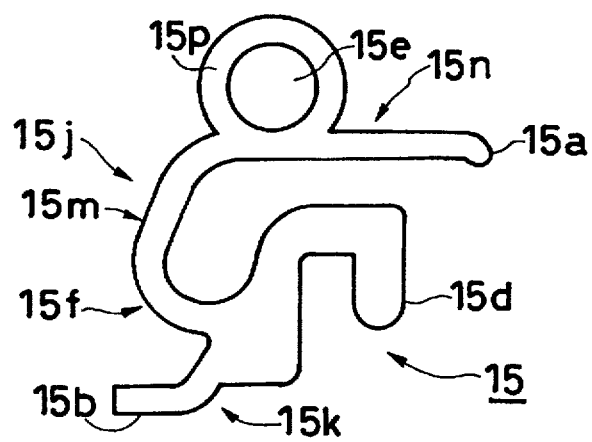

Referring to FIGS. 6A, 6B, and 6C, the structure of the electronic component connector 12 according to a third embodiment of the present invention is different from that of the electronic component connector 12 according to the second embodiment in that each contact pin 5, which makes contact with a corresponding electrode terminal 2a, is replaced with a contact pin 15, and that each contact pin 9, which makes contact with a corresponding electrode terminal 2b, is replaced with a contact pin 19.

The contact pin 19 has a press fit portion 19d, a module connection portion 19j located on one side of the press fit portion 19d, and an electronic circuit board connection portion 19k located on the other side of the press fit portion 19d. The module connection portion 19j is shorter than the module connection portion 9j of the contact pin 9, but the contact pin 19 is substantially identical to the contact pin 9.

The contact pin 15 has a press fit portion 15d, a module connection portion 15j, and an electronic circuit board connection portion 15k. In the contact pin 5 of the first and second embodiments, the tip 5a of the module connection portion 5j, which has a shape of the letter "C" as viewed from a side, makes contact with the electrode terminal 2a. By contrast, in the contact pin 15, the module connection portion 15j, which corresponds to the C-shaped module connection portion 5j of the contact pin 5, includes a C-shaped portion 15m, a rounded portion 15f located below the C-shaped portion 15m, and a linear portion 15n located at the substantially same level as that of the upper end of the C-shaped portion 15m, and the tip 15a of the linear portion 15n makes contact with the electrode terminal 2a. Further, a rod-receiving portion 15p is formed in the vicinity of the boundary between the C-shaped portion 15m and the linear portion 15n. The rod-receiving portion 15p has a rod hole 15e through which a connection rod 7 for canceling a pressing force is to be inserted. The tip 15b of the electronic circuit board connection portion 15k is soldered to a corresponding electrode 20 formed on an electronic circuit board 27.

In the above-described structure of the contact pin 15, the rounded portion 15f serves as a bending center of the module connection portion 15j, and is located lower than is a holding portion of the chip-on-board module 6 (a portion held between the tip 15a and the tip 19a). Further, the turning locus of the tip 15a of the contact pin 15 is larger than that of the tip 5a of the contact pin 5 of the first or second embodiment. As a result, the contact pin 15 can be opened/closed at a relatively small turning angle, whereas the contact pin 5 must be deflected to its near elastic limit when it is to be opened.

Not illustrated, but the contact pins 19, the contact pins 15, and separator members similar to the separator members 11 of the first and second embodiments are arranged in an alternating manner along each of the four side peripheral portions of the frame member 8. Also, as in the case of the separator members 11 of the first and second embodiments, an engagement portion having a semicircular cross-section is formed in each of the separator members so as to engage thereinto a connection rod which is inserted into the rod holes 15e and used to cancel a pressing force of the contact pins 15.

Figure 7:
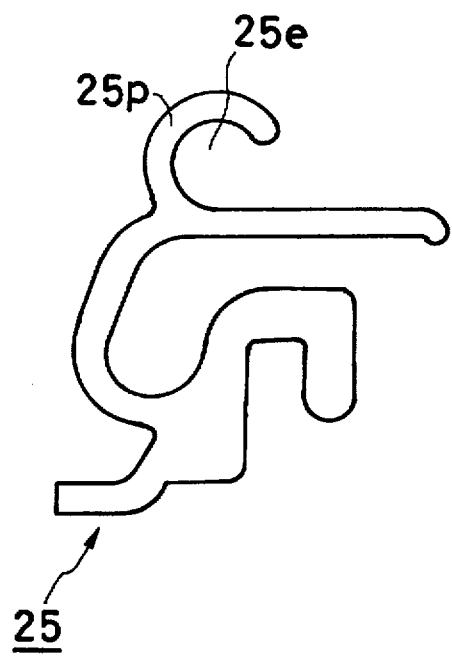
FIG. 7 is a schematic side view showing another contact pin used in the electronic component connector according to the third embodiment.

The contact pin which contacts the electrode terminal 2a is not limited to the contact pin 15 having the rod-receiving portion 15p which has the rod hole 15e shaped as shown in FIG. 6C. For example, the contact pin may be a contact pin 25 having a rod-receiving portion 25p which has a rod hole 25e having a substantially semicircular shape as shown in FIG. 7.

Also, in the present embodiment, the electronic component connector 12 has an opening 81 at its central portion, and the frame member 8 of the electronic component connector 12 has a predetermined height $h_0$. Thus, another electronic component 31 can be mounted under the chip-on-board module 6. As a result, as in the case of the electronic component connector 12 according to the first or second embodiment, a layered structure of mounted components can be realized. This reduces an area occupied by mounted components on the electronic circuit board 27. Also, the chip-on-board module 6 can be readily attached to/removed from the electronic component connector 12. Thus, after the chip-on-board module 6 is mounted onto the electronic circuit board 27 through use of the electronic component connector 12, the chip-on-board module 6 can be removed from the electronic component connector 12 so as to inspect or replace the electronic component 31 which is mounted under the chip-on-board module 6.

Fourth Embodiment

Figure 8A:
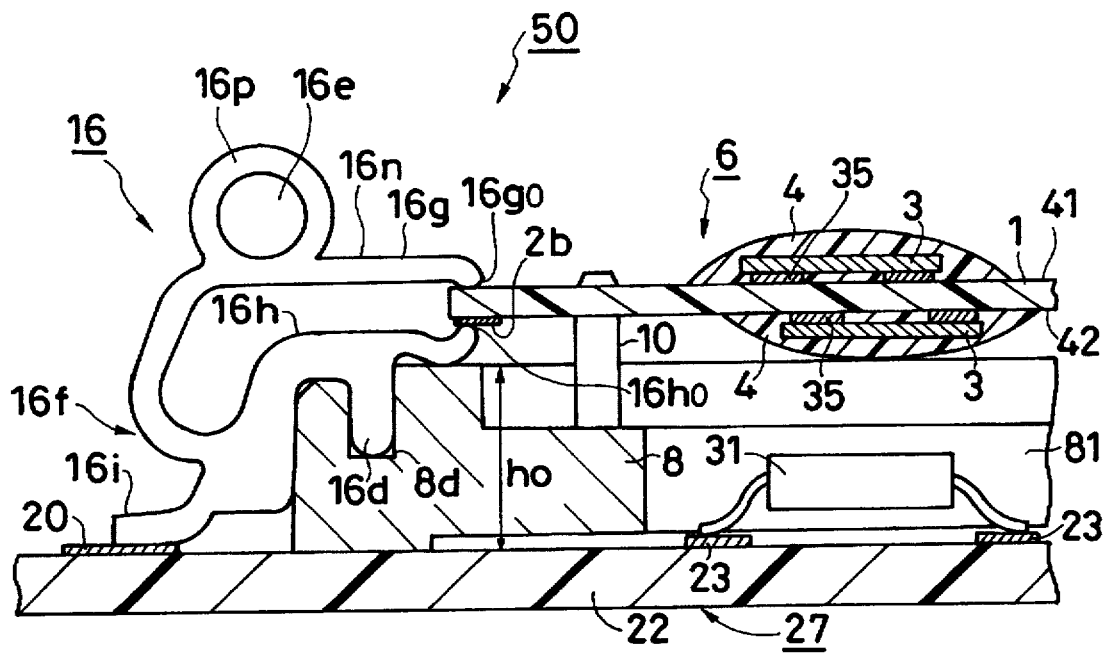
FIGS. 8A and 8B are enlarged partial cross-sectional views for explaining an electronic component connector according to a fourth embodiment of the present invention.
Figure 8B:
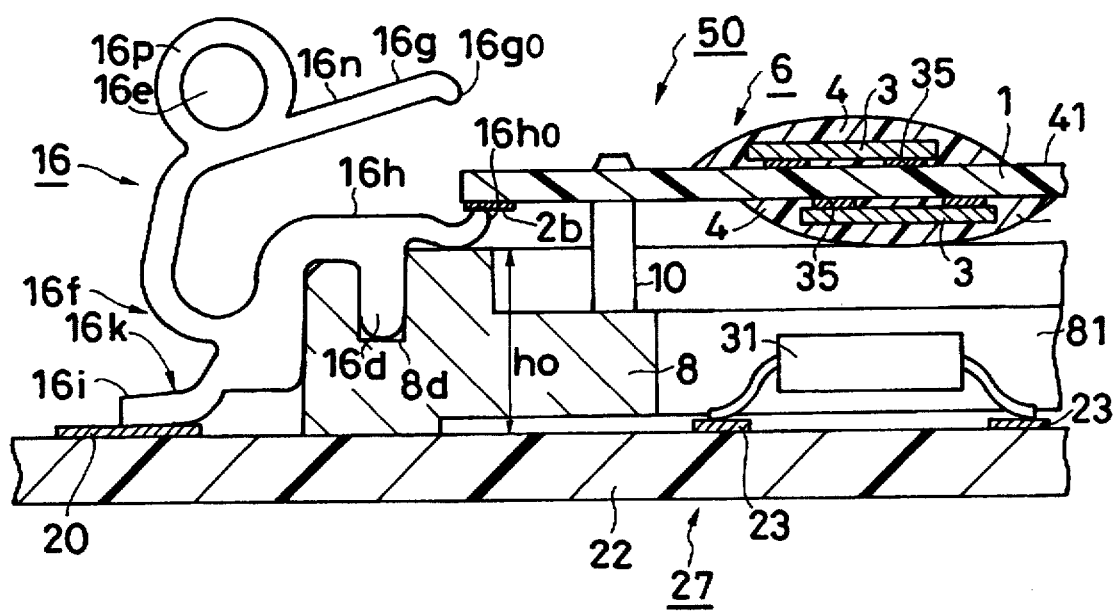

An electronic component connector 12 according to a fourth embodiment of the present invention will now be described with reference to FIGS. 8A and 8B. FIG. 8A shows the electronic component connector 12 with each contact pin 16 being closed, and FIG. 8B shows the electronic component connector 12 with the contact pin 16 being opened.

In a chip-on-board module 6 used in the present embodiment, each electrode terminal 2b for connection with an external circuit is formed on the main face 42 of the board 1.

The contact pin 16 is formed of an elastic metal such as beryllium copper having an electrical conductivity as well as a spring property. The contact pin 16 has an upper portion 16g and a lower portion 16h which elastically hold the chip-on-board module through their tips, a rounded portion 16f, which is located lower than are the upper and lower portions 16g and 16h, connects the upper portion 16g and the lower portion 16h, and serves as a bending center for the upper portion 16g, a projecting piece 16i which projects from the lower portion 16h, a rod-receiving portion 16p formed on the upper portion 16g and having a rod hole 16e, a press fit portion 16d formed on the lower portion 16h, a tip $16g_0$ of the upper portion 16g, and a tip $16h_0$ of the lower portion 16h.

The contact pins 16 having the above-described structure are arranged along each of the four side peripheral portions of the frame member 8 such that their press fit portions 16d are press-fit into corresponding press fit holes 8d which are formed in the frame member 8 along each of the four side peripheral portions. The projecting piece 16i of the contact pin 16 makes contact with a corresponding electrode 20 formed on the electronic circuit board 27; the tip $16h_0$ of the lower portion 16h makes contacts with the electrode terminal 2b formed on the main face 42 of the chip-on-board module 6; the tip $16g_0$ of the upper portion 16g makes contacts with the face 41 opposite to the main face 42 with which the tip $16h_0$ makes contact. The contact pin 16 is soldered at the projecting piece 16i to the electrode 20, elastically presses the chip-on-board module 6 through the tip $16g_0$, and elastically supports the chip-on-board module 6 through the tip $16h_0$.

In the electronic component connector 12 which uses the contact pin 16 having the above-described structure, the chip-on-board module 6 can be attached to/removed from the electronic component connector 16 in a manner similar to that in the electronic component connectors according to the first through third embodiments. In the case of the electronic component connector 12 according to the fourth embodiment, as in the case of the electronic component connector according to the third embodiment, the upper portion 16g includes a linear portion 16n, and the rounded portion 16f which serves as a bending center is located lower than is the holding portion of the chip-on-board module 6. Thus, even when the contact pin 16 is repeatedly switched from the open state (FIG. 8B) to the closed state (FIG. 8A) and vice versa, the contact pin 16 is not deflected to its near elastic limit in distinction from the contact pins 5 of the first or second embodiment. Accordingly, the contact pin 16 can stably hold and fix the chip-on-board module 6 and provide a reliable electrical connection between the electrode 2b and the electrode 20. Also, since the chip-on-board module 6 is held and fixed between the upper portion 16g and the lower portion 16h of the contact pin 16, a burden on the frame member 8 is reduced with respect to the holding/fixing of the chip-on-board module 6. This improves the reliability of the electronic component connector 12, especially at high temperatures.

Not illustrated, but a plurality of the contact pins 16 and separator members similar to the separator members 11 of the first and second embodiments are arranged in an alternating manner along each of the four side peripheral portions of the frame member 8. Also, as in the case of the separator members 11 of the first and second embodiments, an engagement portion having a semicircular cross-section is formed in each of the separator members so as to engage thereinto a connection rod which is inserted into the rod holes 15e and used to cancel a pressing force of the contact pins 16.

Figure 9:
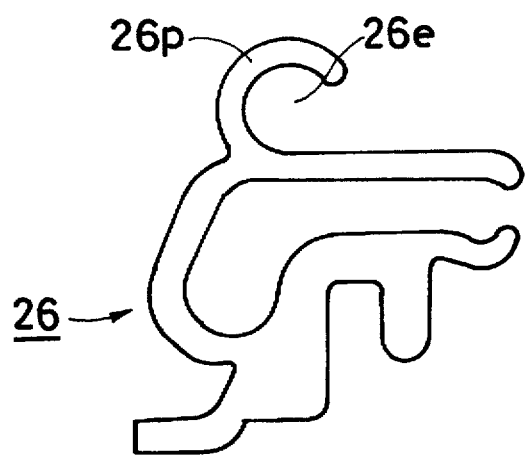
FIG. 9 is a schematic side view showing another contact pin used in the electronic component connector according to the fourth embodiment.

A contact pin is not limited to the contact pin 16 having the rod-receiving portion 16p which has the rod hole 16e shaped as shown in FIGS. 8A and 8B. The contact pin may be a contact pin 26 having a rod-receiving portion 26p which has a rod hole 26e having a substantially semicircular shape as shown in FIG. 9.

Also, in the present embodiment, the electronic component connector 12 has an opening 81 at its central portion, and the frame member 8 of the electronic component connector 12 has a predetermined height $h_0$. Thus, another electronic component 31 can be mounted under the chip-on-board module 6. As a result, as in the case of the electronic component connector 12 according to the first, second, or third embodiment, a layered structure of mounted components can be realized. This reduces an area occupied by mounted components on the electronic circuit board. Also, the chip-on-board module 6 can be readily attached to/removed from the electronic component connector 12. Thus, after the chip-on-board module 6 is mounted onto the electronic circuit board 27 through use of the electronic component connector 12, the chip-on-board module 6 can be removed from the electronic component connector 12 so as to inspect or replace the electronic component 31 which is mounted under the chip-on-board module 6.

Fifth Embodiment

Figure 10:
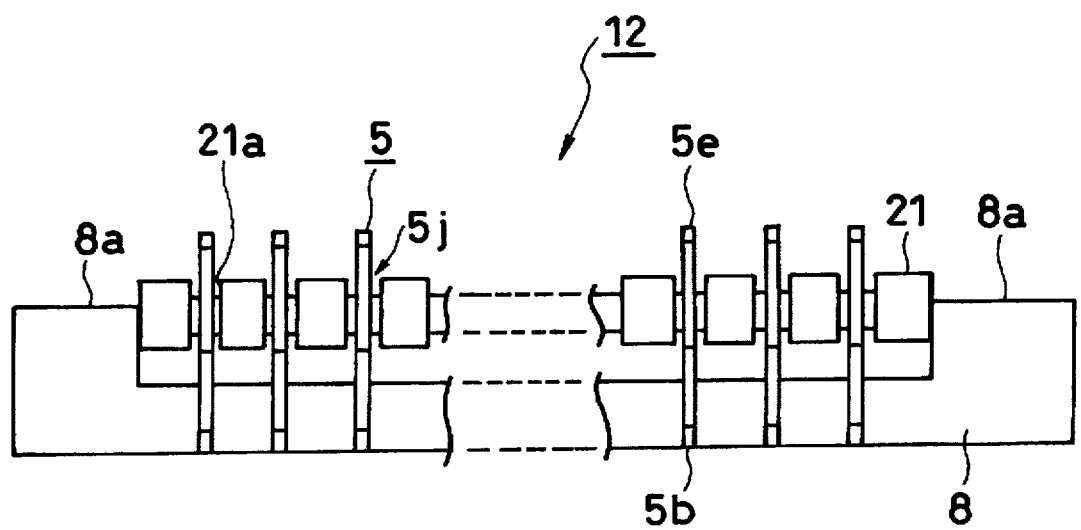
FIG. 10 is an enlarged partial side view for explaining an electronic component connector according to a fifth embodiment of the present invention.

In an electronic component connector 12 according to a fifth embodiment of the present invention, a stopper 8a is formed at each of the four corners of the frame member 8, as shown in FIG. 10. There lies between the stoppers 8a a rod-shaped insulating separator member 21. Groove portions 21a are formed in the separator member 21 at predetermined intervals. The C-shaped portion 5j of each contact pin 5 same as that of the first embodiment is fit into the groove portion 21a.

In the present embodiment, the structure of the separator member 21 for insulating the contact pins 5 from each other can be made simple. Also, insulation can be readily established between the contact pins 5 even when there exist a relatively large number of the contact pins 5.

What is claimed is:

1. An electronic component connector used for mounting an electronic component, comprising:
   a frame member; and
   an elastic member attached to said frame member, said elastic member having an elastic member attachment portion attached to said frame member, an electronic component pressing portion capable of pressing said electronic component toward said frame member, and a press-canceling member engagement portion integrally attached to said electronic component pressing portion,
   wherein said electronic component pressing portion is movable in a direction away from said frame member by engaging a press-canceling member with said press-canceling member engagement portion and moving said press-canceling member in a direction away from said frame member, and
   wherein said electronic component pressing portion has a contact portion capable of making contact with said electronic component, and a curved portion which extends from said contact portion toward said elastic member attachment portion, and said curved portion is curved toward said frame member.

2. An electronic component connector, comprising:
   a frame member; and
   an elastic member attached to said frame member, said elastic member having an elastic member attachment portion attached to said frame member, an electronic component pressing portion capable of pressing said electronic component toward said frame member, and a press-canceling member engagement portion integrally attached to said electronic component pressing portion,
   wherein said electronic component pressing portion is movable in a direction away from said frame member by engaging a press-canceling member with said press-canceling member engagement portion and moving said press-canceling member in a direction away from said frame member,
   wherein said electronic component pressing portion has a contact portion capable of making contact with said electronic component, a linear portion which extends substantially linearly and is located at a contact portion side, and a curved portion which is located at an elastic member attachment portion side, said linear portion and said curved portion are located at the elastic member attachment portion side with respect to said contact portion, and said curved portion is curved toward said frame member.

3. An electronic component connector as recited in claim 1, wherein said elastic member is electrically conductive.

4. An electronic component connector as recited in claim 3, wherein said elastic member is further provided with an external connection portion.

5. An electronic component connector, comprising:
   a frame member; and
   an elastic member attached to said frame member, said elastic member having an elastic member attachment portion attached to said frame member, an electronic component pressing portion capable of pressing said electronic component toward said frame member, and a press-canceling member engagement portion integrally attached to said electronic component pressing portion,
   wherein said electronic component pressing portion is movable in direction away from said frame member by engaging a press-canceling member with said press-canceling member engagement portion and moving said press-canceling member in a direction away from said frame member, and
   wherein said elastic member is further provided with a second electronic component pressing portion capable of pressing said electronic component in a direction away from said frame member.

6. An electronic component connector as recited in claim 5, wherein said second electronic component pressing portion is electrically conductive.

7. An electronic component connector, comprising:
   a frame member;
   an elastic member attached to said frame member, said elastic member having an elastic member attachment portion attached to said frame member, an electronic component pressing portion capable of pressing said electronic component toward said frame member, and a press-canceling member engagement portion integrally attached to said electronic component pressing portion; and
   a second elastic member attached to said frame member, said second elastic member having a second elastic member attachment portion attached to said frame member, and a second electronic component pressing portion capable of pressing said electronic component in a direction away from said frame member,
   wherein said electronic component pressing portion is movable in a direction away from said frame member by engaging a press-canceling member with said press-canceling member engagement portion and moving said press-canceling member in a direction away from said frame member.

8. An electronic component connector as recited in claim 7, wherein said second elastic member is electrically conductive.

9. An electronic component connector, comprising:
   a frame member;
   an elastic member attached to said frame member, said elastic member having an elastic member attachment portion attached to said frame member, an electronic component pressing portion capable of pressing said electronic component toward said frame member, and a press-canceling member engagement portion integrally attached to said electronic component pressing portion; and
   a press-canceling member engagement member to which said press-canceling member can be engaged, said press-canceling member engagement member being immovably attached to said frame member,
   wherein said electronic component pressing portion is movable in direction away from said frame member by engaging a press-canceling member with said press-canceling member engagement portion and moving said press-canceling member in a direction away from said frame member.

10. An electronic component connector as recited in claim 9, wherein said press-canceling member engagement member comprises an engagement portion with which said press-canceling member can be engaged, said engagement portion having two side walls and a groove disposed therebetween, one of the two side walls which is located closer to said electronic component pressing portion is higher than the other side wall.

11. An electronic component connector as recited in claim 3, wherein a plurality of said conductive elastic members are attached to said frame member, and insulating separator members are respectively provided between said conductive elastic members.

12. An electronic component connector, comprising:

a frame member; and an elastic member attached to said frame member, said elastic member having an elastic member attachment portion attached to said frame member, an electronic component pressing portion capable of pressing said electronic component toward said frame member, and a press-canceling member engagement portion integrally attached to said electronic component pressing portion, wherein said electronic component pressing portion is movable in direction away from said frame member by engaging a press-canceling member with said press-canceling member engagement portion and moving said press-canceling member in a direction away from said frame member, wherein said elastic member is electrically conductive, wherein a plurality of said conductive elastic members are attached to said frame member, and insulating separator members are respectively provided between said conductive elastic members, and wherein said separator member has a press-canceling member engagement portion to which said press-canceling member can be engaged.

13. An electronic component connector as recited in claim 12, wherein said press-canceling member engagement portion comprises two side walls and a groove disposed therebetween, one of the two side walls which is located closer to said electronic component pressing portion is higher than the other side wall.

14. An electronic component connector as recited in claim 8, wherein a plurality of said conductive elastic members and a plurality of said second conductive elastic members are attached to said frame member, and said elastic members and said second elastic members are alternately arranged such that insulating separator members are respectively disposed between each of said elastic members and each of said second elastic members.

15. An electronic component connector as recited in claim 14, wherein said separator member has a press-canceling member engagement portion to which said press-canceling member can be engaged.

16. An electronic component connector as recited in claim 15, wherein said press-canceling member engagement portion comprises two side walls and a groove disposed therebetween, one of the two side walls which is located closer to said electronic component pressing portion is higher than the other side wall.

17. An electronic component connector as recited in claim 1, wherein said frame member has an opening with a predetermined height between first and second opposite sides thereof, and when said frame member is mounted on an electronic circuit board such that said second side faces said electronic circuit board, another electronic component is allowed to be mounted onto a portion of said electronic circuit board which is exposed in said opening.

18. An electronic component connector as recited in claim 1, wherein positioning members are projected from said frame member.

19. An electronic component connector as recited in claim 1, further comprising said press-canceling member.

20. A connector-attached electronic component, comprising:

an electronic component; and a connector including a frame member and an elastic member attached to said frame member, said elastic member having an elastic member attachment portion attached to said frame member, an electronic component pressing portion capable of pressing said electronic component toward said frame member, and a press-canceling member engagement portion integrally attached to said electronic component pressing portion, wherein said electronic component pressing portion is movable in a direction away from said frame member, by engaging a press-canceling member with said press-canceling member engagement portion and moving said press-canceling member in a direction away from said frame member, thereby allowing said electronic component to be attached to/removed from said connector, wherein said electronic component pressing portion has a contact portion capable of making contact with said electronic component, and a curved portion which extends from said contact portion toward said elastic member attachment portion, and said curved portion is curved toward said frame member.

21. A connector-attached electronic component as recited in claim 20, further comprising a press-canceling member engagement member to which said press-canceling member can be engaged, wherein said press-canceling member engagement member is immovably attached to said frame member.

22. A connector-attached electronic component as recited in claim 20, wherein said frame member has an opening with a predetermined height between first and second opposite sides thereof, and when said frame member is mounted on an electronic circuit board such that said second side faces said electronic circuit board, another electronic component is allowed to be mounted onto a portion of said electronic circuit board which is exposed in said opening.

23. A connector-attached electronic component as recited in claim 20, wherein said press-canceling member engagement portion is attached to said curved portion of said electronic component pressing portion.

* * * * *